(12) United States Patent
An et al.

(10) Patent No.: US 8,410,584 B2
(45) Date of Patent: Apr. 2, 2013

(54) SEMICONDUCTOR DEVICE PACKAGES WITH ELECTROMAGNETIC INTERFERENCE SHIELDING

(75) Inventors: JaeSeon An, Paju-Si (KR); Jeong Lee, Paju-Si (KR); SangJin Cha, Paju-Si (KR); SungHo Youn, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 474 days.

(21) Appl. No.: 12/432,621

(22) Filed: Apr. 29, 2009

(65) Prior Publication Data

US 2010/0032815 A1 Feb. 11, 2010

Related U.S. Application Data

(60) Provisional application No. 61/087,268, filed on Aug. 8, 2008.

(51) Int. Cl.
*H01L 23/552* (2006.01)
(52) U.S. Cl. .......... 257/660; 257/659; 438/121
(58) Field of Classification Search .......... 257/659, 257/660, 704, 706, 796; 361/748, 818; 438/113, 438/119, 127
See application file for complete search history.

(56) References Cited

U.S. PATENT DOCUMENTS

| | | |
|---|---|---|
| 3,390,226 A | 6/1968 | Beyerlein |
| 4,569,786 A | 2/1986 | Deguchi |
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie, Jr. |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,557,142 A | 9/1996 | Gilmore et al. |
| 5,600,181 A | 2/1997 | Scott et al. |
| 5,639,989 A | 6/1997 | Higgins, III |

(Continued)

FOREIGN PATENT DOCUMENTS

| | | |
|---|---|---|
| CN | 1442033 A | 9/2003 |
| CN | 1774804 A | 5/2006 |

(Continued)

OTHER PUBLICATIONS

Chiu et al. "Wafer-Level Semiconductor Device Packages With Electromagnetic Interference Shielding." U.S. Appl. No. 12/622,393, filed Nov. 19, 2009.

(Continued)

*Primary Examiner* — Kimberly Rizkallah
*Assistant Examiner* — Errol Fernandes
(74) *Attorney, Agent, or Firm* — Foley & Lardner LLP

(57) ABSTRACT

Described herein are semiconductor device packages with EMI shielding and related methods. In one embodiment, a semiconductor device package includes: (1) a substrate unit including a grounding element disposed adjacent to a periphery of the substrate unit and at least partially extending between an upper surface and a lower surface of the substrate unit; (2) a semiconductor device disposed adjacent to the upper surface of the substrate unit; (3) a package body disposed adjacent to the upper surface of the substrate unit and covering the semiconductor device; and (4) an EMI shield disposed adjacent to exterior surfaces of the package body. A periphery of the package body is laterally recessed, such that a connection surface of the grounding element is electrically exposed and electrically connected to the EMI shield. The grounding element provides an electrical pathway to ground electromagnetic emissions incident upon the EMI shield.

22 Claims, 9 Drawing Sheets

U.S. PATENT DOCUMENTS

| | | | |
|---|---|---|---|
| 5,677,511 A | 10/1997 | Taylor et al. | |
| 5,694,300 A | 12/1997 | Mattei et al. | |
| 5,703,761 A | 12/1997 | Heiss | |
| 5,726,612 A | 3/1998 | Mandai | |
| 5,729,437 A | 3/1998 | Hashimoto | |
| 5,776,798 A | 7/1998 | Quan et al. | |
| 5,847,930 A | 12/1998 | Kazle | |
| 5,864,088 A | 1/1999 | Sato et al. | |
| 5,886,876 A * | 3/1999 | Yamaguchi | 361/767 |
| 5,895,229 A | 4/1999 | Carney et al. | |
| 5,898,344 A | 4/1999 | Hayashi | |
| 5,966,052 A | 10/1999 | Sakai | |
| 5,977,626 A | 11/1999 | Wang et al. | |
| 5,998,867 A | 12/1999 | Jensen et al. | |
| 6,079,099 A | 6/2000 | Uchida et al. | |
| 6,093,972 A | 7/2000 | Carney et al. | |
| 6,150,193 A | 11/2000 | Glenn | |
| 6,194,250 B1 | 2/2001 | Melton et al. | |
| 6,225,694 B1 | 5/2001 | Terui | |
| 6,255,143 B1 | 7/2001 | Briar | |
| 6,261,680 B1 | 7/2001 | Denman | |
| 6,369,335 B1 | 4/2002 | Wajima | |
| 6,376,769 B1 | 4/2002 | Chung | |
| 6,448,632 B1 | 9/2002 | Takiar et al. | |
| 6,455,864 B1 | 9/2002 | Featherby et al. | |
| 6,472,598 B1 | 10/2002 | Glenn | |
| 6,472,743 B2 | 10/2002 | Huang et al. | |
| 6,479,903 B2 | 11/2002 | Briar | |
| 6,492,194 B1 | 12/2002 | Bereau et al. | |
| 6,521,978 B2 | 2/2003 | Fenk et al. | |
| 6,566,596 B1 | 5/2003 | Askew | |
| 6,586,822 B1 | 7/2003 | Vu et al. | |
| 6,602,737 B2 | 8/2003 | Wu | |
| 6,614,102 B1 | 9/2003 | Hoffman et al. | |
| 6,635,953 B2 | 10/2003 | Wu | |
| 6,680,529 B2 | 1/2004 | Chen et al. | |
| 6,686,649 B1 | 2/2004 | Matthews et al. | |
| 6,695,985 B2 | 2/2004 | Igarashi et al. | |
| 6,740,546 B2 | 5/2004 | Corisis et al. | |
| 6,740,959 B2 | 5/2004 | Alcoe et al. | |
| 6,757,181 B1 | 6/2004 | Villanueva | |
| 6,781,231 B2 | 8/2004 | Minervini | |
| 6,800,804 B2 | 10/2004 | Igarashi et al. | |
| 6,838,776 B2 | 1/2005 | Leal et al. | |
| 6,856,007 B2 | 2/2005 | Warner | |
| 6,865,084 B2 | 3/2005 | Lin et al. | |
| 6,867,480 B2 | 3/2005 | Legaspi, Jr. et al. | |
| 6,881,896 B2 * | 4/2005 | Ebihara | 174/546 |
| 6,900,383 B2 | 5/2005 | Babb et al. | |
| 6,928,719 B2 | 8/2005 | Kim et al. | |
| 6,962,869 B1 | 11/2005 | Bao et al. | |
| 6,967,403 B2 | 11/2005 | Chuang et al. | |
| 6,975,516 B2 | 12/2005 | Asahi et al. | |
| 6,992,400 B2 | 1/2006 | Tikka et al. | |
| 6,998,532 B2 | 2/2006 | Kawamoto et al. | |
| 7,012,323 B2 | 3/2006 | Warner et al. | |
| 7,030,469 B2 | 4/2006 | Mahadevan et al. | |
| 7,045,385 B2 | 5/2006 | Kim et al. | |
| 7,049,682 B1 | 5/2006 | Mathews et al. | |
| 7,081,661 B2 | 7/2006 | Takehara et al. | |
| 7,125,744 B2 | 10/2006 | Takehara et al. | |
| 7,126,218 B1 | 10/2006 | Darveaux et al. | |
| 7,161,252 B2 | 1/2007 | Tsuneoka et al. | |
| 7,180,012 B2 | 2/2007 | Tsuneoka et al. | |
| 7,183,498 B2 | 2/2007 | Ogura et al. | |
| 7,186,928 B2 | 3/2007 | Kikuchi et al. | |
| 7,187,060 B2 | 3/2007 | Usui | |
| 7,294,587 B2 | 11/2007 | Asahi et al. | |
| 7,327,015 B2 | 2/2008 | Yang et al. | |
| 7,342,303 B1 | 3/2008 | Berry et al. | |
| 7,372,151 B1 | 5/2008 | Fan et al. | |
| 7,445,968 B2 | 11/2008 | Harrison et al. | |
| 7,446,265 B2 | 11/2008 | Krohto et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,566,955 B2 | 7/2009 | Warner | |
| 7,576,415 B2 | 8/2009 | Cha et al. | |
| 7,588,951 B2 | 9/2009 | Mangrum et al. | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,643,311 B2 * | 1/2010 | Coffy | 361/818 |
| 7,656,047 B2 | 2/2010 | Yang et al. | |
| 7,700,411 B2 | 4/2010 | Yang et al. | |
| 7,741,151 B2 | 6/2010 | Amrine et al. | |
| 7,745,910 B1 | 6/2010 | Olson et al. | |
| 7,772,046 B2 | 8/2010 | Pagaila et al. | |
| 7,799,602 B2 | 9/2010 | Pagaila et al. | |
| 7,829,981 B2 | 11/2010 | Hsu | |
| 7,989,928 B2 | 8/2011 | Liao et al. | |
| 8,022,511 B2 | 9/2011 | Chiu et al. | |
| 8,030,750 B2 | 10/2011 | Kim et al. | |
| 8,093,690 B2 | 1/2012 | Ko et al. | |
| 8,110,902 B2 | 2/2012 | Eun et al. | |
| 8,212,339 B2 | 7/2012 | Liao et al. | |
| 8,212,340 B2 | 7/2012 | Liao et al. | |
| 2002/0053724 A1 | 5/2002 | Lai et al. | |
| 2002/0093108 A1 | 7/2002 | Grigorov | |
| 2004/0020673 A1 | 2/2004 | Mazurkiewicz | |
| 2004/0063242 A1 | 4/2004 | Kamezos | |
| 2004/0150097 A1 | 8/2004 | Gaynes et al. | |
| 2004/0178500 A1 * | 9/2004 | Usui | 257/734 |
| 2004/0231872 A1 | 11/2004 | Arnold et al. | |
| 2004/0252475 A1 | 12/2004 | Tsuneoka et al. | |
| 2005/0013082 A1 | 1/2005 | Kawamoto et al. | |
| 2005/0029673 A1 | 2/2005 | Naka et al. | |
| 2005/0039946 A1 | 2/2005 | Nakao | |
| 2005/0045358 A1 | 3/2005 | Arnold | |
| 2005/0046001 A1 | 3/2005 | Warner | |
| 2005/0208702 A1 | 9/2005 | Kim | |
| 2006/0145361 A1 | 7/2006 | Yang et al. | |
| 2006/0148317 A1 | 7/2006 | Akaike et al. | |
| 2006/0160261 A1 | 7/2006 | Sheats et al. | |
| 2006/0266547 A1 * | 11/2006 | Koga | 174/255 |
| 2006/0292753 A1 | 12/2006 | Takahashi | |
| 2007/0030661 A1 * | 2/2007 | Morris et al. | 361/818 |
| 2007/0176281 A1 | 8/2007 | Kim et al. | |
| 2007/0241437 A1 | 10/2007 | Kagaya et al. | |
| 2008/0042301 A1 | 2/2008 | Yang et al. | |
| 2008/0061407 A1 * | 3/2008 | Yang et al. | 257/660 |
| 2008/0128890 A1 | 6/2008 | Choi et al. | |
| 2008/0174013 A1 | 7/2008 | Yang et al. | |
| 2008/0210462 A1 | 9/2008 | Kawagishi et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0025211 A1 | 1/2009 | Hiner et al. | |
| 2009/0027863 A1 | 1/2009 | Karnezos | |
| 2009/0035895 A1 | 2/2009 | Lee et al. | |
| 2009/0075428 A1 | 3/2009 | Tang et al. | |
| 2009/0102003 A1 | 4/2009 | Vogt et al. | |
| 2009/0102033 A1 | 4/2009 | Raben | |
| 2009/0152688 A1 | 6/2009 | Do et al. | |
| 2009/0194851 A1 | 8/2009 | Chiu et al. | |
| 2009/0194852 A1 | 8/2009 | Chiu et al. | |
| 2009/0230487 A1 | 9/2009 | Saitoh et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0236700 A1 | 9/2009 | Moriya | |
| 2009/0256244 A1 | 10/2009 | Liao et al. | |
| 2009/0261470 A1 | 10/2009 | Choi et al. | |
| 2009/0294928 A1 | 12/2009 | Kim et al. | |
| 2009/0302435 A1 | 12/2009 | Pagaila et al. | |
| 2009/0302446 A1 | 12/2009 | Lee et al. | |
| 2010/0006330 A1 | 1/2010 | Fu et al. | |
| 2010/0013064 A1 | 1/2010 | Hsu | |
| 2010/0109132 A1 | 5/2010 | Ko et al. | |
| 2010/0110656 A1 | 5/2010 | Ko et al. | |
| 2010/0140759 A1 | 6/2010 | Pagaila et al. | |
| 2010/0207257 A1 | 8/2010 | Lee | |

| | | | | | |
|---|---|---|---|---|---|
| 2010/0207258 A1 | 8/2010 | Eun et al. | JP | 04206858 | 7/1992 |
| 2010/0207259 A1 | 8/2010 | Liao et al. | JP | 05129476 | 5/1993 |
| 2010/0244208 A1 | 9/2010 | Pagaila et al. | JP | 08-288686 | 1/1996 |
| 2011/0006408 A1 | 1/2011 | Liao | JP | 08288686 | 11/1996 |
| 2011/0037169 A1 | 2/2011 | Pagaila et al. | JP | 2003273571 | 9/2003 |
| 2011/0068459 A1 | 3/2011 | Pagaila et al. | WO | WO 2004/060034 A1 | 7/2004 |
| 2011/0115059 A1 | 5/2011 | Lee | WO | WO 2006076613 | 7/2006 |
| 2011/0115060 A1 | 5/2011 | Chiu et al. | | | |
| 2011/0115066 A1 | 5/2011 | Kim | | | |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |

OTHER PUBLICATIONS

Kim et al. "Semiconductor Device Packages With Electromagnetic Interference Shielding." U.S. Appl. No. 12/622,415, filed Nov. 19, 2009.

Lee et al. "Semiconductor Device Packages With Electromagnetic Interference Shielding." U.S. Appl. No. 12/622,419, filed Nov. 19, 2009.

Weng et al., "Semiconductor Package and Manufacturing Methods Thereof." U.S. Appl. No. 12/955,782, filed Nov. 29, 2009.

* cited by examiner

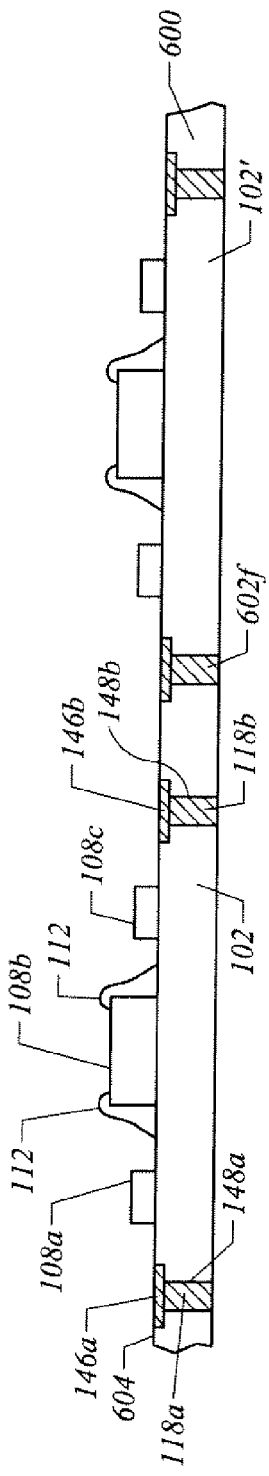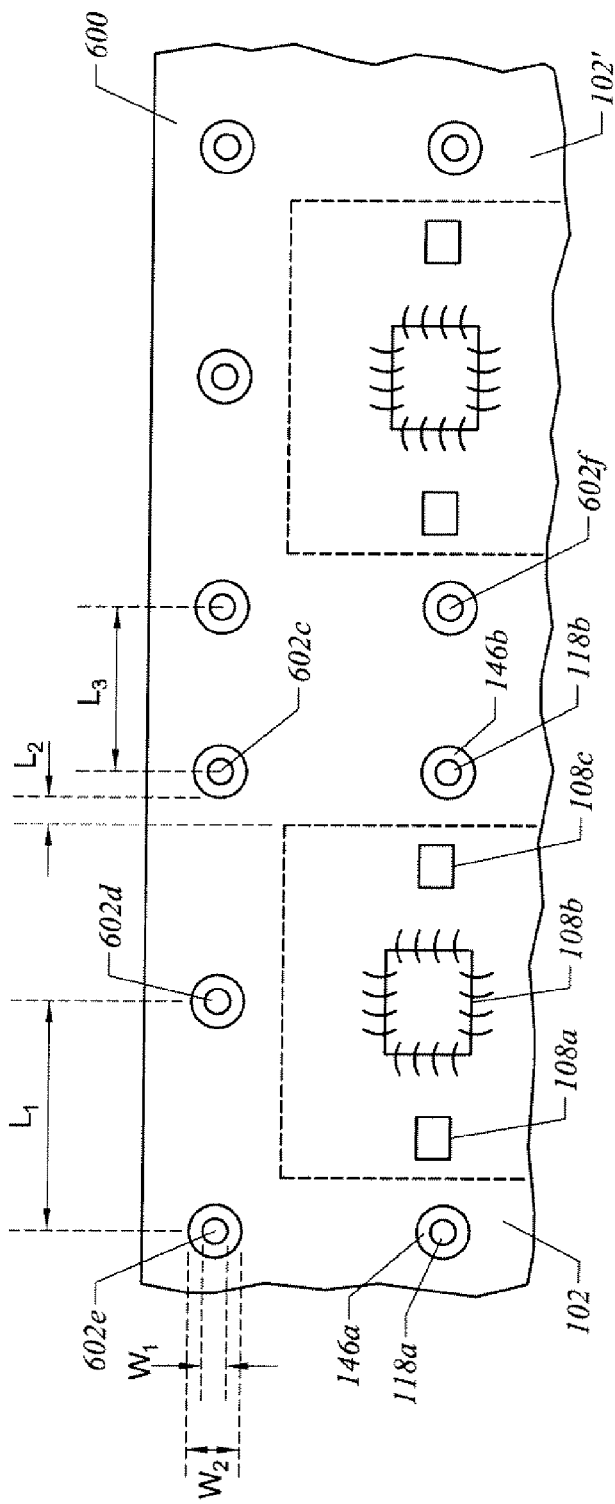

SEMICONDUCTOR DEVICE PACKAGES WITH ELECTROMAGNETIC INTERFERENCE SHIELDING

CROSS REFERENCE TO RELATED APPLICATION

This application claims the benefit of U.S. Provisional Application Ser. No. 61/087,268, filed on Aug. 8, 2008, the disclosure of which is incorporated herein by reference in its entirety.

FIELD OF THE INVENTION

The invention relates generally to semiconductor device packages. More particularly, the invention relates to semiconductor device packages with electromagnetic interference shielding.

BACKGROUND

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

While an electrically conductive casing can reduce EMI, the use of the casing can suffer from a number of disadvantages. In particular, the casing is typically secured to an exterior of a semiconductor device package by an adhesive. Unfortunately, the casing can be prone to peeling or falling off, since binding characteristics of the adhesive can be adversely affected by temperature, humidity, and other environmental conditions. Also, when securing the casing to the package, the size and shape of the casing and the size and shape of the package should match within relatively small tolerance levels. This matching of sizes and shapes and associated precision in relative positioning of the casing and the package can render manufacturing operations costly and time consuming. Because of this matching of sizes and shapes, it also follows that semiconductor device packages of different sizes and shapes can require different casings, which can further increase manufacturing cost and time to accommodate the different packages.

It is against this background that a need arose to develop the semiconductor device packages and related methods described herein.

SUMMARY

One aspect of the invention relates to semiconductor device packages with EMI shielding. In one embodiment, a semiconductor device package includes: (1) a substrate unit including (a) an upper surface, (b) a lower surface, and (c) a grounding element disposed adjacent to a periphery of the substrate unit and at least partially extending between the upper surface and the lower surface of the substrate unit, the grounding element including a connection surface disposed adjacent to the upper surface of the substrate unit; (2) a semiconductor device disposed adjacent to the upper surface of the substrate unit and electrically connected to the substrate unit; (3) a package body disposed adjacent to the upper surface of the substrate unit and covering the semiconductor device, a periphery of the package body being laterally recessed with respect to the periphery of the substrate unit, such that the connection surface of the grounding element is electrically exposed, the package body including exterior surfaces; and (4) an EMI shield disposed adjacent to the exterior surfaces of the package body and electrically connected to the connection surface of the grounding element. The grounding element provides an electrical pathway to ground electromagnetic emissions incident upon the EMI shield.

In another embodiment, the semiconductor device package includes: (1) a substrate unit including (a) a first surface, (b) a second opposing surface, and (c) a grounding element at least partially extending between the first surface and the second opposing surface of the substrate unit, the grounding element corresponding to a remnant of a grounding via and including a connection surface disposed adjacent to a peripheral portion of the first surface of the substrate unit; (2) a semiconductor device disposed adjacent to the first surface of the substrate unit and electrically connected to the substrate unit; (3) a package body disposed adjacent to the first surface of the substrate unit and covering the semiconductor device, a periphery of the package body being recessed with respect to a periphery of the substrate unit, such that the connection surface of the grounding element is electrically exposed adjacent to the peripheral portion of the first surface of the substrate unit, the package body including exterior surfaces; and (4) an EMI shield disposed adjacent to the exterior surfaces of the package body and electrically connected to the connection surface of the grounding element.

Another aspect of the invention relates to methods of forming semiconductor device packages with EMI shielding. In one embodiment, a method includes: (1) providing a substrate including an upper surface, a lower surface, and grounding vias at least partially extending between the upper surface and the lower surface of the substrate; (2) electrically connecting a semiconductor device to the upper surface of the substrate; (3) applying a molding material to the upper surface of the substrate to form a molded structure covering the grounding vias and the semiconductor device; (4) forming a first set of cutting slits extending through the molded structure, such that: (a) the molded structure is sub-divided to form a package body covering the semiconductor device, the package body including lateral surfaces defining a periphery of the package body; and (b) portions of the grounding vias are disposed beyond the periphery of the package body and include connection surfaces; (5) forming an electromagnetic interference coating adjacent to the package body and the connection surfaces; and (6) forming a second set of cutting slits extending through the electromagnetic interference coating and the substrate, such that: (a) the electromagnetic interference coating is sub-divided to form an electromagnetic interference shield disposed adjacent to the package body and the connection surfaces; (b) the substrate is sub-divided to form a substrate unit including an upper surface, the semiconductor device disposed adjacent to the upper surface of the substrate unit; and (c) the connection surfaces are disposed adjacent to a peripheral portion of the upper surface of the substrate unit.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

FIG. 6A through FIG. 6H illustrate a method of forming the semiconductor device package of FIG. 1, according to an embodiment of the invention.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a grounding element can include multiple grounding elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, the terms "inner," "interior," "outer," "exterior," "upper," "upwardly," "lower," "downwardly," "vertical," "lateral," and "laterally" refer to a relative orientation of a set of components, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
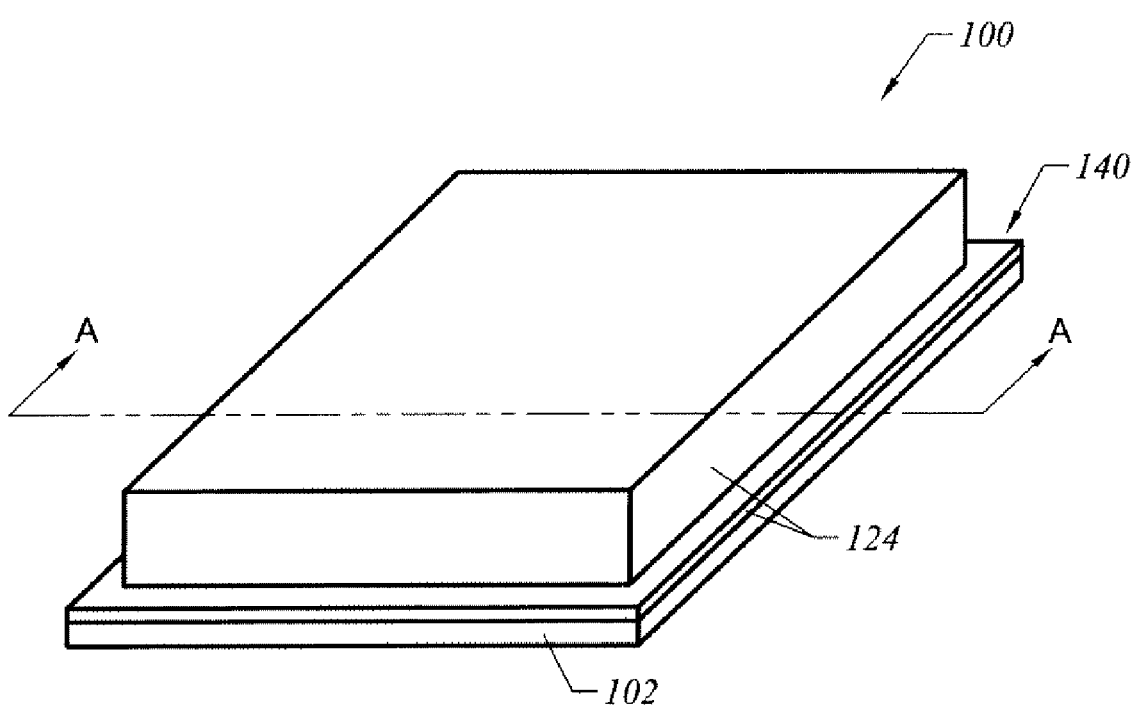
FIG. 1 illustrates a perspective view of a semiconductor device package implemented in accordance with an embodiment of the invention.
Figure 2:
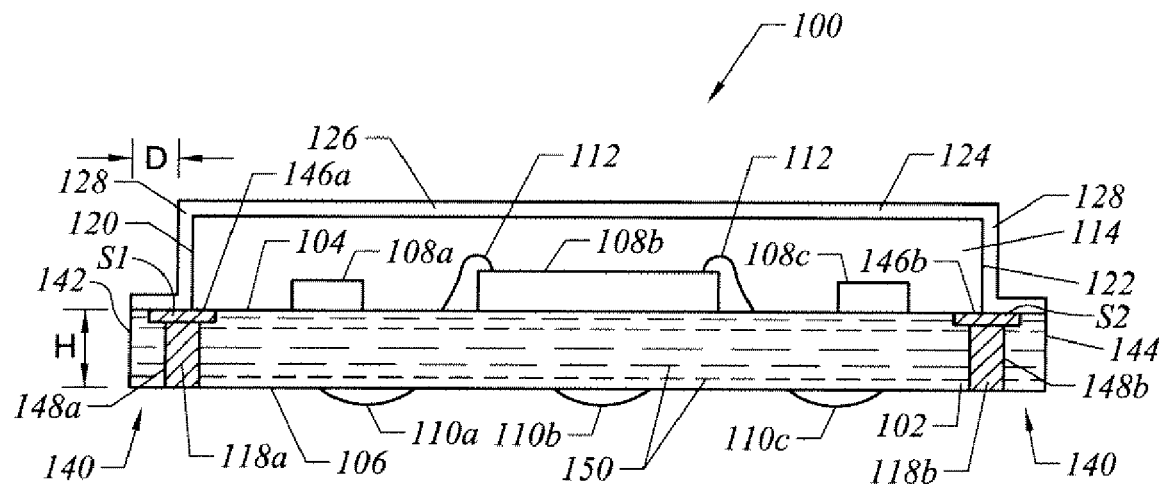
FIG. 2 illustrates a cross-sectional view of the semiconductor device package of FIG. 1, taken along line A-A of FIG. 1.

Attention first turns to FIG. 1 and FIG. 2, which illustrate a semiconductor device package 100 implemented in accordance with an embodiment of the invention. In particular, FIG. 1 illustrates a perspective view of the package 100, while FIG. 2 illustrates a cross-sectional view of the package 100, taken along line A-A of FIG. 1.

In the illustrated embodiment, the package 100 includes a ledge 140, which is disposed adjacent to a periphery of the package 100 and extends outwardly from sides of the package 100. In particular, the ledge 140 extends around substantially the entire periphery of the package 100, although it is contemplated that the extent of the ledge 140 around the package 100 can vary for other implementations. As illustrated in FIG. 1 and FIG. 2, the ledge 140 is disposed adjacent to a bottom of the package 100, and, in conjunction with the sides of the package 100, defines an "L"-shaped lateral profile that extends around substantially the entire periphery of the package 100. It is contemplated that the lateral profile of the package 100, in general, can be any of a number of shapes, which can be implemented by varying shapes of the ledge 140 and the sides of the package 100 or by varying the positioning of the ledge 140 with respect to the sides of the package 100. It is also contemplated that the lateral profile of the package 100 can be curved, inclined, or roughly textured. For certain implementations, a lateral extent D) of the ledge 140 can be in the range of about 50 micrometer ("μm") to about 500 μm, such as from about 50 μm to about 400 μm or from about 100 μm to about 300 μm.

Referring to FIG. 1 and FIG. 2, the package 100 includes a substrate unit 102, which includes an upper surface 104, a lower surface 106, and lateral surfaces 142 and 144 disposed along sides of the substrate unit 102. In the illustrated embodiment, the lateral surfaces 142 and 144 are substantially planar and have a substantially orthogonal orientation with respect to the upper surface 104 or the lower surface 106, although it is contemplated that the shapes and orientations of the lateral surfaces 142 and 144 can vary for other implementations. The substrate unit 102 can be implemented in any of a number of ways, and includes electrical interconnect 150 to provide electrical pathways between the upper surface 104 and the lower surface 106. The electrical interconnect 150 can include, for example, a set of electrically conductive layers that are incorporated within a set of dielectric layers. The electrically conductive layers can be connected to one another by internal vias, and can be implemented so as to sandwich a core formed from a suitable resin, such as one based on bismaleimide and triazine or based on epoxy and polyphenylene oxide. For example, the substrate unit 102 can include a substantially slab-shaped core that is sandwiched by one set of electrically conductive layers disposed adjacent to an upper surface of the core and another set of electrically conductive layers disposed adjacent to a lower surface of the core. For certain implementations, most, or all, of the electrically conductive layers can be disposed within an interior of the substrate unit 102, so as to reduce or minimize exposure of the electrically conductive layers adjacent to the lateral surfaces 142 and 144. For example, at most one of the electrically conductive layers, such as a lowermost electrically conductive layer, can be exposed adjacent to the lateral surfaces 142 and 144. In such manner, the electrically conductive layers can provide electrical pathways between the upper surface 104 and the lower surface 106, while being protected against oxidation, humidity, and other environmental conditions within the interior of the substrate unit 102.

For certain implementations, a thickness of the substrate unit 102, namely a distance between the upper surface 104 and the lower surface 106, can be in the range of about 0.1 millimeter ("mm") to about 2 mm, such as from about 0.2 mm to about 1.5 mm or from about 0.3 mm to about 1 mm. While not illustrated in FIG. 2, it is contemplated that a solder mask layer can be disposed adjacent to either, or both, the upper surface 104 and the lower surface 106 of the substrate unit 102. Also, a protective layer can be disposed adjacent to the lateral surfaces 142 and 144 of the substrate unit 102, so as to render protection for any exposed electrically conductive layer.

As illustrated in FIG. 2, the substrate unit 102 includes grounding elements 118a and 118b that are disposed adjacent to a periphery of the substrate unit 102. The grounding elements 118a and 118b are elongated structures at least partially extending between the upper surface 104 and the lower surface 106 of the substrate unit 102 and, as further described below, provide electrical pathways to reduce EMI. In the illustrated embodiment, the grounding elements 118a and 118b are implemented as grounding vias, each including a via pad 146a or 146b disposed adjacent to the upper surface 104 of the substrate unit 102 and a plated channel 148a or 148b extending between the via pad 146a or 146b and the electrical interconnect 150 included in the substrate unit 102. For certain implementations, a height H of the grounding elements 118a and 118b, namely a vertical extent of the grounding elements 118a and 118b, can be somewhat less than the thickness of the substrate unit 102, and can be in the range of about 0.1 mm to about 1.5 mm, such as from about 0.1 mm to about 1 mm or from about 0.2 mm to about 0.5 mm. However, it is contemplated that the extent of the grounding elements 118a and 118b can vary for other implementations. Still referring to FIG. 2, the grounding elements 118a and 118b include connection surfaces S1 and S2, respectively, which are electrically exposed adjacent to the upper surface 104 of the substrate unit 102. In the illustrated embodiment, the connection surfaces S1 and S2 correspond to electrically exposed surfaces of the via pads 146a and 146b, respectively. Advantageously, the relatively large areas of the connection surfaces S1 and S2 can enhance reliability and efficiency of electrical connections for reducing EMI.

As illustrated in FIG. 2, the package 100 also includes semiconductor devices 108a, 108b, and 108c, which are disposed adjacent to the upper surface 104 of the substrate unit 102, and electrical contacts 110a, 110b, and 110c, which are disposed adjacent to the lower surface 106 of the substrate unit 102. The semiconductor device 108b is wire-bonded to the substrate unit 102 via a set of wires 112, which are formed from gold or another suitable electrically conductive material, and the semiconductor devices 108a and 108c are surface mounted to the substrate unit 102. In the illustrated embodiment, the semiconductor device 108b is a semiconductor chip, while the semiconductor devices 108a and 108c are passive devices, such as resistors, capacitors, or inductors. The electrical contacts 110a, 110b, and 110c provide input and output electrical connections for the package 100, and at least a subset of the electrical contacts 110a, 110b, and 110c are electrically connected to the semiconductor devices 108a, 108b, and 108c via the electrical interconnect 150 included in the substrate unit 102. In the illustrated embodiment, at least one of the electrical contacts 110a, 110b, and 110c is a ground electrical contact and is electrically connected to the grounding elements 118a and 118b via the electrical interconnect 150 included in the substrate unit 102. While three semiconductor devices are illustrated in FIG. 2, it is contemplated that more or less semiconductor devices can be included for other implementations, and that semiconductor devices, in general, can be any active devices, any passive devices, or combinations thereof. It is also contemplated that the number of electrical contacts can vary from that illustrated in FIG. 2.

Still referring to FIG. 2, the package 100 also includes a package body 114 that is disposed adjacent to the upper surface 104 of the substrate unit 102. In conjunction with the substrate unit 102, the package body 114 substantially covers or encapsulates the semiconductor devices 108a, 108b, and 108c and the wires 112 to provide mechanical stability as well as protection against oxidation, humidity, and other environmental conditions. The package body 114 is formed from a molding material, and includes exterior surfaces, including lateral surfaces 120 and 122 disposed along sides of the package body 114. In the illustrated embodiment, the lateral surfaces 120 and 122 are substantially planar and have a substantially orthogonal orientation with respect to the upper surface 104 or the lower surface 106, although it is contemplated that the lateral surfaces 120 and 122 can be curved, inclined, stepped, or roughly textured for other implementations. As illustrated in FIG. 2, the lateral surfaces 120 and 122 are substantially parallel with the lateral surfaces 142 and 144, respectively. Also, a periphery of the package body 114, as defined by the lateral surfaces 120 and 122, is laterally recessed with respect to the periphery of the substrate unit 102, as defined by the lateral surfaces 142 and 144. More particularly, the package body 114 is laterally recessed so as to reduce or minimize coverage of a peripheral portion of the upper surface 104 of the substrate unit 102, including portions of the via pads 146a and 146b, thereby allowing the connection surfaces S1 and S2 to be electrically exposed. For other implementations, it is contemplated that the shapes of the lateral surfaces 120 and 122 and their lateral recessing with respect to the lateral surfaces 142 and 144 can be varied from that illustrated in FIG. 2, while allowing the connection surfaces S1 and S2 to be at least partially electrically exposed.

As illustrated in FIG. 1 and FIG. 2, the package 100 further includes an EMI shield 124 that is disposed adjacent to the exterior surfaces of the package body 114 and the peripheral portion of the upper surface 104 of the substrate unit 102. The EMI shield 124 is formed from an electrically conductive material, and substantially surrounds the semiconductor devices 108a, 108b, and 108c within the package 100 to provide protection against EMI. In the illustrated embodiment, the EMI shield 124 includes a top portion 126 and a lateral portion 128, which extends around substantially the entire periphery of the package body 114 and defines the "L"-shaped lateral profile of the package 100. As illustrated in FIG. 2, the lateral portion 128 extends downwardly from the top portion 126 and also extends laterally along the peripheral portion of the upper surface 104 so as to terminate substantially at the periphery of the substrate unit 102. However, it is contemplated that the extent of the lateral portion 128 can be varied for other implementations.

As illustrated in FIG. 2, the EMI shield 124 is electrically connected to the connection surfaces S1 and S2 of the grounding elements 118a and 118b. When electromagnetic emissions radiated from an interior of the package 100 strike the EMI shield 124, at least a portion of these emissions can be efficiently grounded via the grounding elements 118a and 118b, thereby reducing the level of emissions that can pass through the EMI shield 124 and adversely affect neighboring semiconductor devices. Similarly, when electromagnetic emissions from a neighboring semiconductor device strike the EMI shield 124, a similar grounding can occur to reduce EMI of the semiconductor devices 108a, 108b, and 108c within the package 100. During operation, the package 100 can be disposed on a printed circuit board ("PCB") and electrically connected to the PCB via the electrical contacts 110a, 110b, and 110c. As previously described, at least one of the electrical contacts 110a, 110b, and 110c is a ground electrical contact, and the ground electrical contact can be electrically connected to a ground voltage provided by the PCB. Grounding of electromagnetic emissions incident upon the EMI shield 124 can occur through an electrical pathway including the grounding elements 118a and 118b, the electrical interconnect 150 included in the substrate unit 102, and the ground electrical contact.

In the illustrated embodiment, the EMI shield 124 is a conformal shield that is formed as a set of layers or films. Advantageously, the EMI shield 124 can be formed adjacent to and in direct contact with an exterior of the package 100 without the use of an adhesive, thereby enhancing reliability and resistance to temperature, humidity, and other environmental conditions. Also, the conformal characteristics of the EMI shield 124 allow similar EMI shields and similar manufacturing operations to be readily applied to semiconductor device packages of different sizes and shapes, thereby reducing manufacturing cost and time to accommodate the different packages. For certain implementations, a thickness of the EMI shield 124 can be in the range of about 1 μm to about 500 μm, such as from about 1 μm to about 200 μm, from about 1 μm to about 100 μm, from about 10 μm to about 100 μm, from about 1 μm to about 50 μm, or from about 1 μm to about 10 μm. Such reduced thickness of the EMI shield 124, relative to a typical casing, allows a reduced overall package size, and is a further advantage of the illustrated embodiment.

Figure 3:
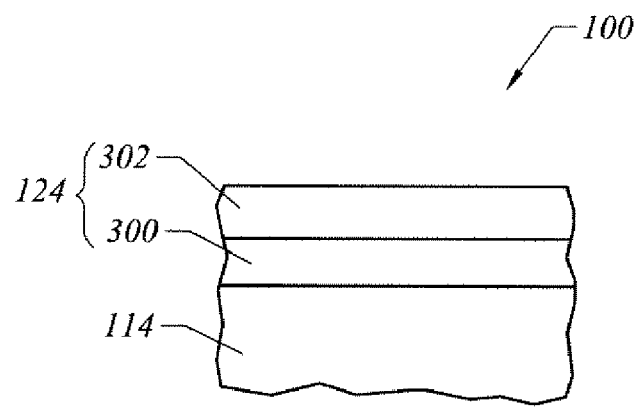
FIG. 3 illustrates an enlarged, cross-sectional view of a portion of the semiconductor device package of FIG. 1.

Attention next turns to FIG. 3, which illustrates an enlarged, cross-sectional view of a portion of the package 100 of FIG. 1 and FIG. 2. In particular, FIG. 3 illustrates a particular implementation of the EMI shield 124 that is disposed adjacent to the package body 114.

As illustrated in FIG. 3, the EMI shield 124 is multi-layered and includes an inner layer 300, which is disposed adjacent to the package body 114, and an outer layer 302, which is disposed adjacent to the inner layer 300 and is exposed at the exterior of the package 100. In general, each of the inner layer 300 and the outer layer 302 can be formed from a metal, a metal alloy, a matrix with a metal or a metal alloy dispersed therein, or another suitable electrically conductive material. For example, each of the inner layer 300 and the outer layer 302 can be formed from aluminum, copper, chromium, tin, gold, silver, nickel, stainless steel, or a combination thereof. The inner layer 300 and the outer layer 302 can be formed from the same electrically conductive material or different electrically conductive materials. For example, a metal, such as nickel, can be selected for both the inner layer 300 and the outer layer 302. In some instances, different electrically conductive materials can be selected for the inner layer 300 and the outer layer 302 to provide complementary functionalities. For example, a metal with a higher electrical conductivity, such as aluminum, copper, gold, or silver, can be selected for the inner layer 300 to provide EMI shielding functionality. On the other hand, a metal with a somewhat lower electrical conductivity, such as nickel, can be selected for the outer layer 302 to protect the inner layer 300 against oxidation, humidity, and other environmental conditions. In this case, the outer layer 302 also can contribute to the EMI shielding functionality, while providing the protection functionality. While two layers are illustrated in FIG. 3, it is contemplated that more or less layers can be included for other implementations.

Figure 4:
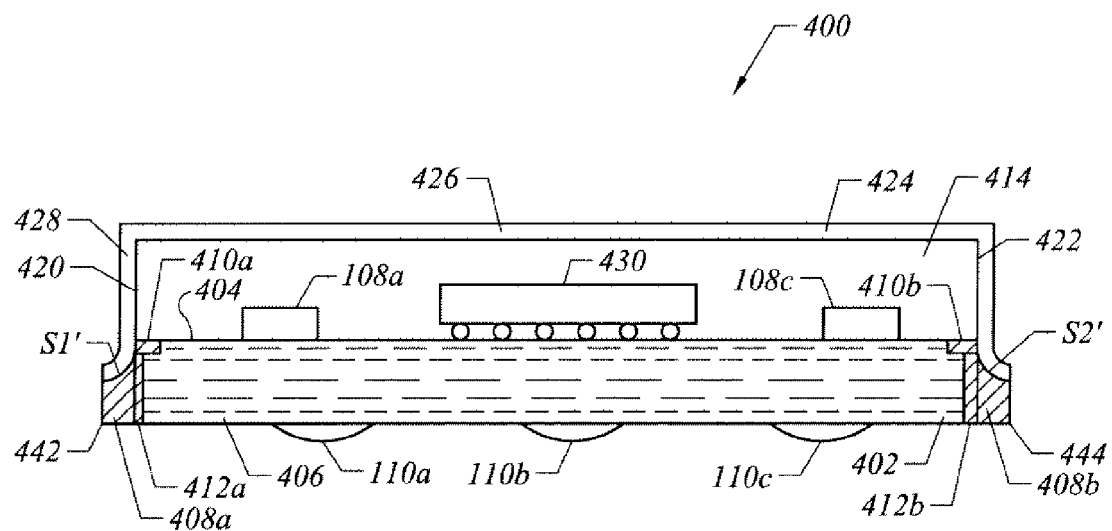
FIG. 4 illustrates a cross-sectional view of a semiconductor device package implemented in accordance with another embodiment of the invention.

FIG. 4 illustrates a cross-sectional view of a semiconductor device package 400 implemented in accordance with another embodiment of the invention. Certain aspects of the package 400 are implemented in a similar manner as previously described for the package 100 of FIG. 1 through FIG. 3 and, thus, are not further described herein.

Referring to FIG. 4, the package 400 includes a substrate unit 402, which includes an upper surface 404, a lower surface 406, and lateral surfaces 442 and 444 disposed along sides of the substrate unit 402. In the illustrated embodiment, a peripheral portion of the upper surface 404 is downwardly curved so as to define a cut-out portion that extends around substantially an entire periphery of the substrate unit 402. It is contemplated that the extent of the cut-out portion around the substrate unit 402 can vary for other implementations.

Figure 5:
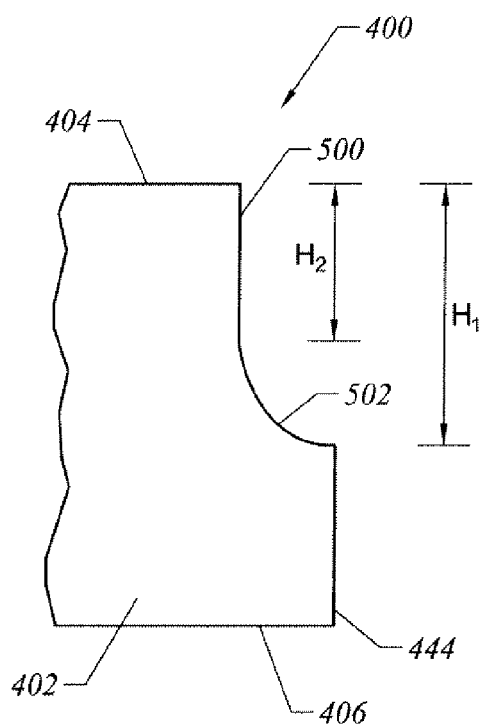
FIG. 5 illustrates an enlarged, cross-sectional view of a portion of the semiconductor device package of FIG. 4.

Certain aspects of the cut-out portion can be further appreciated with reference to FIG. 5, which illustrates an enlarged, cross-sectional view of a portion of the package 400 of FIG. 4. In particular, FIG. 5 illustrates a contour of the substrate unit 402 adjacent to the lateral surface 444, while certain other details of the package 400 are omitted for ease of presentation. In the illustrated embodiment, the peripheral portion of the upper surface 404 includes a set of sections, namely a section 500 and a section 502, which collectively define the cut-out portion of the substrate unit 402. The section 500 is substantially planar and has a substantially orthogonal orientation with respect to the upper surface 404 or the lower surface 406, while the section 502 is curved in a substantially concave manner. As further described herein, the cut-out portion of the substrate unit 402 can be formed in accordance with a set of singulation operations. For certain implementations, a total vertical extent $H_1$ of the cut-out portion can be in the range of about 1 μm to about 100 μm, such as from about 1 μm to about 80 μm or from about 1 μm to about 40 μm, and a vertical extent $H_2$ of the section 500 can correspond to a fractional percentage of $H_1$ in the range of about 1 percent to about 95 percent, such as from about 20 percent to about 80 percent or from about 40 percent to about 60 percent. It is contemplated that the shapes and extents of the sections 500 and 502 can vary for other implementations.

Turning back to FIG. 4, the package 400 also includes grounding elements 408*a* and 408*b*, which at least partially extend between the upper surface 404 and the lower surface 406 of the substrate unit 402 and are disposed adjacent to the periphery of the substrate unit 402. More particularly, the grounding elements 408*a* and 408*b* are disposed substantially at the periphery of the substrate unit 402, and are adjacent to the lateral surfaces 442 and 4443 respectively. In the illustrated embodiment, the grounding elements 408*a* and 408*b* are implemented as grounding vias and, more particularly, as remnants of grounding vias subsequent to a set of singulation operations as further described below. Referring to FIG. 4, each of the grounding elements 408*a* and 408*b* includes a via pad remnant 410*a* or 410*b*, which is disposed adjacent to the upper surface 404 of the substrate unit 402, and a plated channel remnant 412*a* or 412*b*, which extends between the via pad remnant 410*a* or 410*b* and electrical interconnect included in the substrate unit 402. The grounding elements 408*a* and 408*b* include connection surfaces S1' and S2', respectively, which are electrically exposed adjacent to the curved peripheral portion of the upper surface 404. As illustrated in FIG. 4, the connection surfaces S1' and S2' correspond to electrically exposed surfaces of the via pad remnants 410*a* and 410*b* and the plated channel remnants 412*a* and 412*b*. Advantageously, the relatively large areas of the connection surfaces S1' and S2' can enhance reliability and efficiency of electrical connections for reducing EMI.

As illustrated in FIG. 4, the package 400 also includes a semiconductor device 430, which is a semiconductor chip that is disposed adjacent to the upper surface 404 of the substrate unit 402. In the illustrated embodiment, the semiconductor device 430 is flip chip-bonded to the substrate unit 402, such as via a set of solder bumps. It is contemplated that the semiconductor device 430 can be electrically connected to the substrate unit 402 in another manner, such as by wirebonding.

Still referring to FIG. 4, the package 400 also includes a package body 414 that is disposed adjacent to the upper surface 404 of the substrate unit 402. The package body 414 includes exterior surfaces, including lateral surfaces 420 and 422 disposed along sides of the package body 414. In the illustrated embodiment, the lateral surfaces 420 and 422 are substantially planar and have a substantially orthogonal orientation so as to be substantially parallel with the lateral surfaces 442 and 444 of the substrate unit 402. Also, a periphery of the package body 414, as defined by the lateral surfaces 420 and 422, is laterally recessed with respect to the periphery of the substrate unit 402, as defined by the lateral surfaces 442 and 444, thereby reducing or minimizing coverage of the curved peripheral portion of the upper surface 404 of the substrate unit 402. In such manner, the connection surfaces S1' and S2' are electrically exposed. For other implementations, it is contemplated that the shapes of the lateral surfaces 420 and 422 and their lateral recessing with respect to the lateral surfaces 442 and 444 can be varied from that illustrated in FIG. 4, while allowing the connection surfaces S1' and S2' to be at least partially electrically exposed.

The package 400 further includes an EMI shield 424 that is electrically connected to the connection surfaces S1' and S2' of the grounding elements 408*a* and 408*b*. As illustrated in FIG. 4, the EMI shield 424 is disposed adjacent to the exterior surfaces of the package body 414 and the curved peripheral portion of the upper surface 404 of the substrate unit 402. The EMI shield 424 includes a top portion 426 and a lateral portion 428, which extends around substantially the entire periphery of the package body 414 and defines a "J"-shaped lateral profile of the package 400. In the illustrated embodiment, the lateral portion 428 extends downwardly from the top portion 426 and also extends laterally along the curved peripheral portion of the upper surface 404 so as to terminate substantially at the periphery of the substrate unit 402. However, it is contemplated that the extent of the lateral portion 428 can be varied for other implementations.

FIG. 6A through FIG. 6H illustrate a method of forming a semiconductor device package, according to an embodiment of the invention. For ease of presentation, the following manufacturing operations are described with reference to the package 100 of FIG. 1 through FIG. 3. However, it is contemplated that the manufacturing operations can be similarly carried out to form other semiconductor device packages, such as the package 400 of FIG. 4 and FIG. 5.

Referring first to FIG. 6A and FIG. 6B, a substrate 600 is provided. To enhance manufacturing throughput, the substrate 600 includes multiple substrate units, including the substrate unit 102 and an adjacent substrate unit 102', thereby allowing certain of the manufacturing operations to be readily performed in parallel or sequentially. The substrate 600 can be implemented in a strip manner, in which the multiple substrate units are arranged sequentially in a linear fashion, or in an array manner, in which the multiple substrate units are arranged in a two-dimensional fashion. For ease of presentation, the following manufacturing operations are primarily described with reference to the substrate unit 102 and related components, although the manufacturing operations can be similarly carried for other substrate units and related components.

As illustrated in FIG. 6A and FIG. 6B, multiple grounding elements are disposed adjacent to a periphery of each substrate unit. In particular, the grounding elements 118*a* and 118*b*, along with grounding elements 602*c*, 602*d*, and 602*e*, are disposed adjacent to sides of the substrate unit 102. In the illustrated embodiment, the grounding elements are implemented as grounding vias, each including a via pad, such as the via pad 146*a* or 146*b*, and a plated channel, such as the plated channel 148*a* or 148*b*. The grounding elements can be formed in any of a number of ways, such as photolithography, chemical etching, laser drilling, or mechanical drilling to form openings, along with plating of the openings using a metals a metal alloy, a matrix with a metal or a metal alloy dispersed therein, or another suitable electrically conductive material. For certain implementations, an electrically conductive material can be applied to and drawn into the openings so as to substantially fill the openings with the electrically conductive material. For example, the electrically conductive material can include a metal, such as copper, a solder, such as any of a number of fusible metal alloys having melting points in the range of about 90° C. to about 450° C., or an electrically conductive adhesive, such as any of a number of resins having an electrically conductive filler dispersed therein.

In the illustrated embodiment, a via pad, such as the via pad 146*a* or 146*b*, has an annular shape, and a plated channel, such as the plated channel 148*a* or 148*b*, is shaped in the form of a circular cylinder, including a substantially circular cross-section. It is contemplated that the shapes of a via pad and a plated channel, in general, can be any of a number of shapes.

For example, a plated channel can have another type of cylindrical shape, such as an elliptic cylindrical shape, a square cylindrical shape, or a rectangular cylindrical shape, or can have a non-cylindrical shape, such as a cone, a funnel, or another tapered shape. It is also contemplated that lateral boundaries of a plated channel can be curved or roughly textured. For certain implementations, a lateral extent $W_1$ of each plated channel (also sometimes referred to as a via size) can be in the range of about 50 μm to about 300 μm, such as from about 100 μm to about 200 μm or from about 120 μm to about 180 μm, while a lateral extent $W_2$ of each via pad (also sometimes referred to as a via pad size) can be in the range of about 100 μm to about 600 μm, such as from about 200 μm to about 400 μm or from about 240 μm to about 360 μm. If a plated channel or a via pad has a non-uniform shape, the lateral extent $W_1$ or $W_2$ can correspond to, for example, an average of lateral extents along orthogonal directions.

To enhance reliability and efficiency of electrical connections for reducing EMI, grounding elements are disposed adjacent to all four sides of each substrate unit, although the grounding elements also can be disposed adjacent to a subset of the four sides. It is also contemplated that grounding elements can be disposed adjacent to all four corners of each substrate unit or a subset of the four corners. For certain implementations, a spacing $L_1$ of nearest-neighbor grounding elements of a substrate unit (also sometimes referred to as a via pitch) can be in the range of about 0.1 mm to about 3 mm, such as from about 0.5 mm to about 2 mm or from about 0.7 mm to about 1.3 mm. Referring to FIG. 6B, a dashed boundary within each substrate unit defines a "keep-out" portion, within which semiconductor devices are disposed. To reduce or minimize adverse impact on the operation of semiconductor devices, grounding elements of a substrate unit can be spaced apart from the "keep-out" portion by a spacing $L_2$ (also sometimes referred to as a "keep-out" distance). For certain implementations, the spacing $L_2$ can be in the range of about 50 μm to about 300 μm, such as from about 50 μm to about 200 μm or from about 100 μm to about 150 μm. Still referring to FIG. 6B, nearest-neighbor grounding elements of adjacent substrate units are spaced apart by a spacing $L_3$. For example, the grounding element 118b of the substrate unit 102 and a grounding element 602f of the adjacent substrate unit 102' are spaced apart by the spacing $L_3$. Certain considerations for the selection of the spacing $L_3$ are further described below. It is contemplated that the number of grounding elements and their positioning within the substrate 600 can vary from that illustrated in FIG. 6A and FIG. 6B. It is also contemplated that multiple rows of grounding elements can be disposed adjacent to a periphery of each substrate unit.

Once the substrate 600 is provided, the semiconductor devices 108a, 108b, and 108c are disposed adjacent to an upper surface 604 of the substrate 600, and are electrically connected to the substrate unit 102. In particular, the semiconductor device 108b is wire-bonded to the substrate unit 102 via the wires 112, and the semiconductor devices 108a and 108c are surface mounted to the substrate unit 102.

Figure 6C:
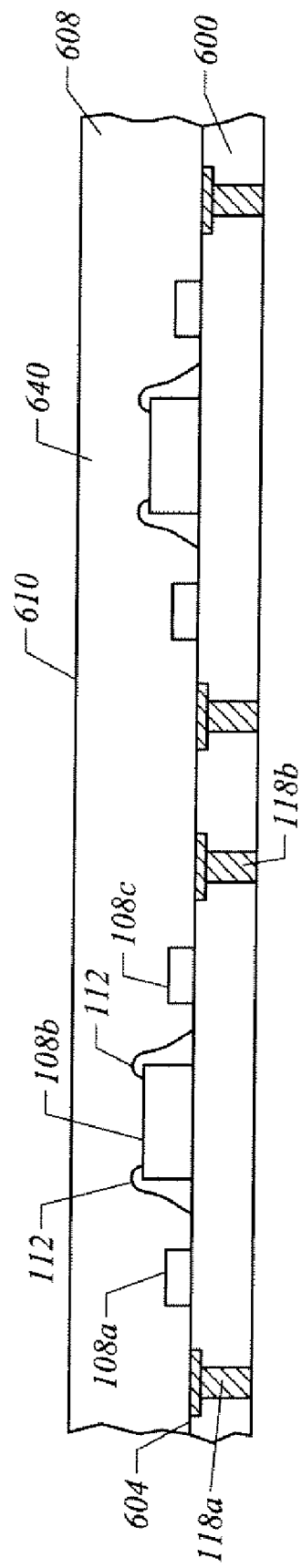

Next, as illustrated in FIG. 6C, a molding material 608 is applied to the upper surface 604 of the substrate 600 so as to substantially cover or encapsulate the grounding elements 118a and 118b, the semiconductor devices 108a, 108b, and 108c, and the wires 112. The molding material 608 can include, for example, a Novolac-based resin, an epoxy-based resin, a silicone-based resin, or another suitable encapsulant. Suitable fillers also can be included, such as powdered $SiO_2$. The molding material 608 can be applied using any of a number of molding techniques, such as compression molding, injection molding, and transfer molding. Once applied, the molding material 608 is hardened or solidified, such as by lowering the temperature to below a melting point of the molding material 608, thereby forming a molded structure 640. To facilitate proper positioning of the substrate 600 during subsequent singulation operations, fiducial marks can be formed in the molded structure 640, such as using laser marking. Alternatively, or in conjunction, fiducial marks can be formed adjacent to a periphery of the substrate 600.

Figure 6D:
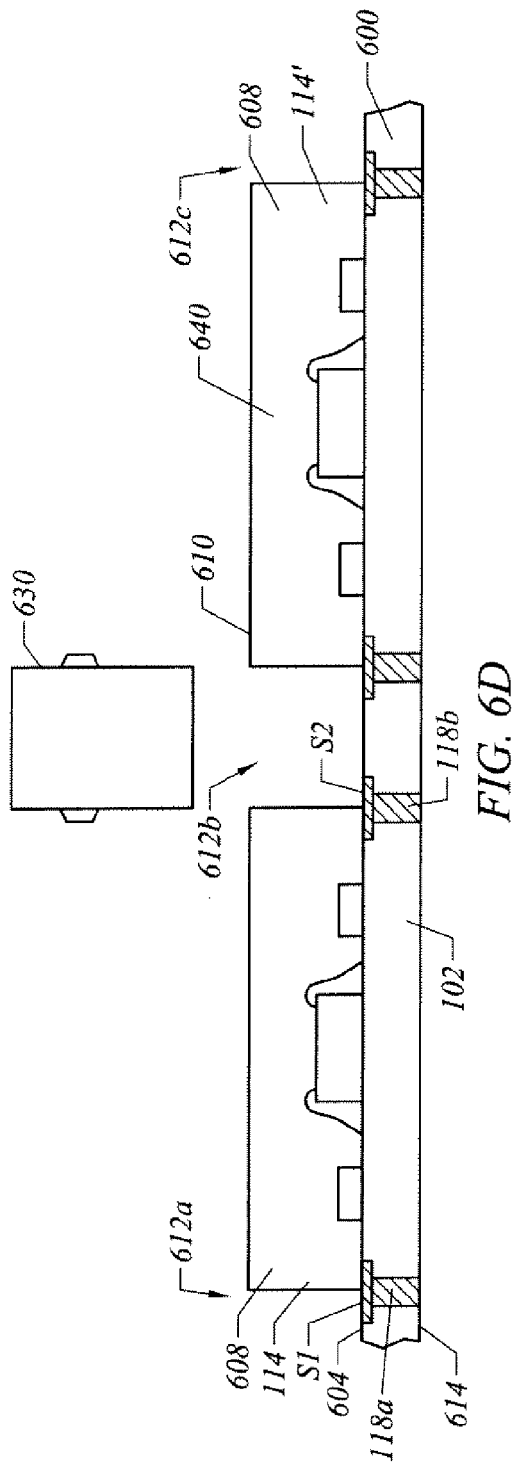
Figure 6E:
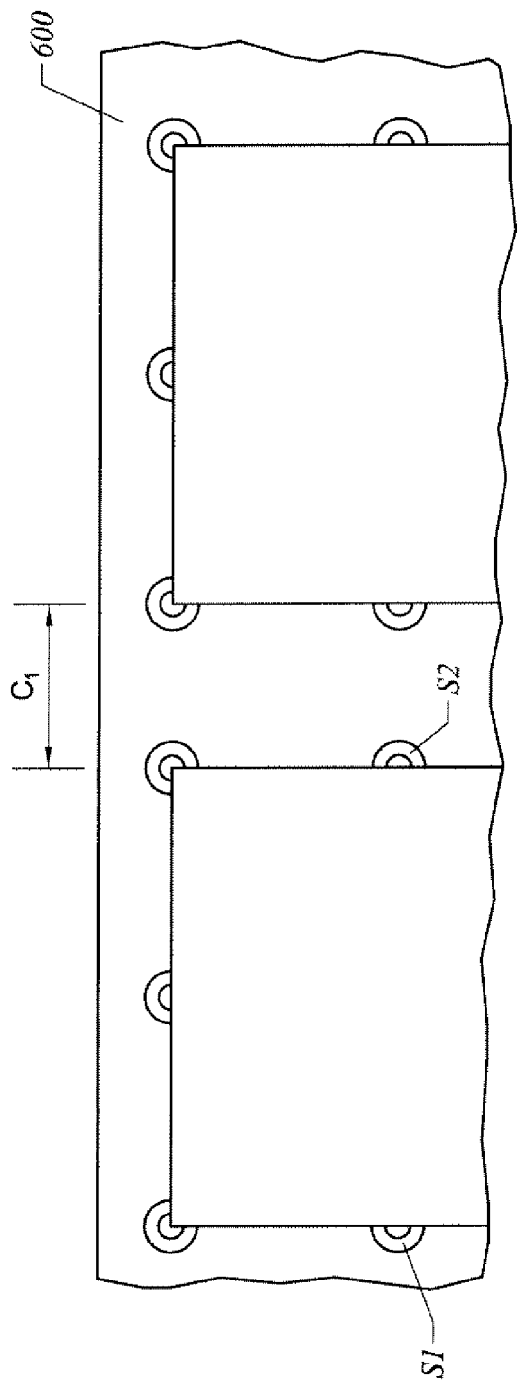

Singulation is next carried out with respect to an upper surface 610 of the molded structure 640 (in its upright orientation). Such manner of singulation can be referred to as "front-side" singulation. Referring to FIG. 6D and FIG. 6E, the "front-side" singulation is carried out using a saw 630, which forms cutting slits 612a, 612b, and 612c. In particular, the cutting slits 612a, 612b, and 612c extend downwardly and completely through the molded structure 640, thereby subdividing the molded structure 640 into discrete units, including the package body 114 and an adjacent package body 114'. In the illustrated embodiment, the cutting slits 612a, 612b, and 612c extend downwardly and terminate substantially at the upper surface 604 of the substrate 600. In such manner, the connection surfaces S1 and S2 of the grounding elements 118a and 118b are exposed to the surroundings at the periphery of the substrate unit 102. For certain implementations, a width $C_1$ of each of the cutting slits 612a, 612b, and 612c (also sometimes referred to as a half-cut width) can be in the range of about 100 μm to about 2,000 μm, such as from about 300 μm to about 1,200 μm or from about 500 μm to about 900 μm.

For other implementations, it is contemplated that the cutting slits 612a, 612b, and 612c can extend below the upper surface 604 of the substrate 600. Moreover, by adjusting the shape of the saw 630 so as to have rounded edges, the resulting shapes of the cutting slits 612a, 612b, and 612c can have curved sections so as to define cut-out portions similar to that previously described in connection with FIG. 4 and FIG. 5. Wile not illustrated in FIG. 6D and FIG. 6E, it is contemplated that a tape can be used to secure a lower surface 614 of the substrate 600 during the "front-side" singulation. The tape can be implemented as a single-sided or double-sided adhesive tape.

Figure 6F:
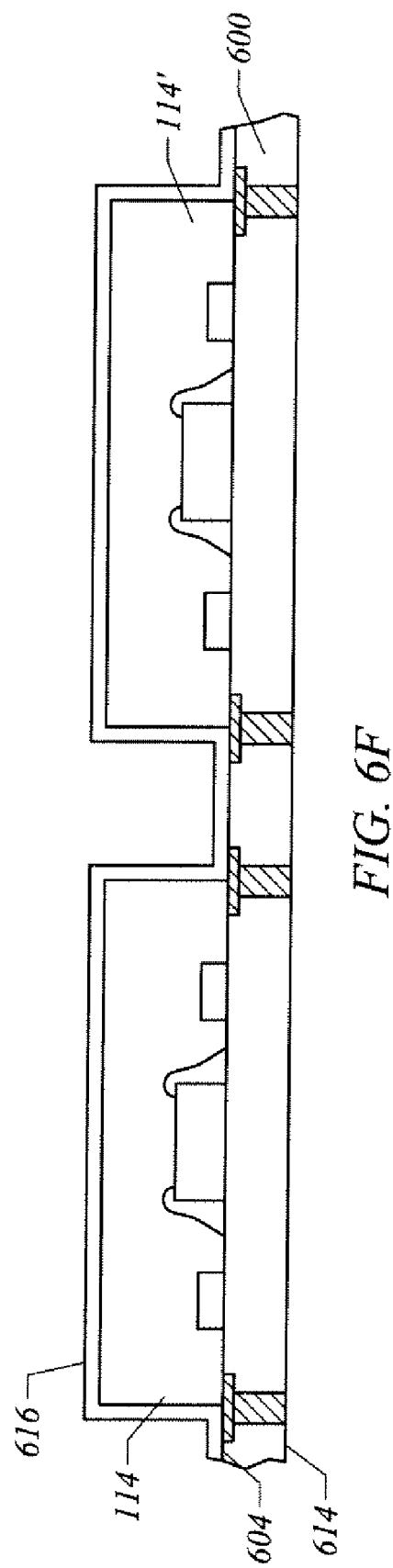

Next, as illustrated in FIG. 6F, an EMI coating 616 is formed adjacent to exterior surfaces of the package bodies 114 and 114' and exposed portions of the upper surface 604 of the substrate 600. The EMI coating 616 can be formed using any of a number of coating techniques, such as chemical vapor deposition, electroless plating, electrolytic plating, printing, spraying, sputtering, and vacuum deposition. For example, the EMI coating 616 can include a single layer that is formed from nickel using electroless plating and with a thickness of at least about 5 μm, such as from about 5 μm to about 50 μm or from about 5 μm to about 10 μm. If the EMI coating 616 is multi-layered, different layers can be formed using the same coating technique or different coating techniques. For example, an inner layer can be formed from copper using electroless plating, and an outer layer can be formed from nickel using either electroless plating or electrolytic plating. As another example, an inner layer (serving as a base layer) can be formed from copper using either sputtering or electroless plating and with a thickness of at least about 1 μm, such as from about 1 μm to about 50 μm or from about 1 μm to about 10 μm, and an outer layer (serving as an anti-oxidation layer) can be formed from stainless steel, nickel, or copper using sputtering and with a thickness no greater than about 1 μm, such as from about 0.01 μm to about 1 μm or from about 0.01 μm to about 0.1 μm. In these examples, surfaces to which the EMI coating 616 is applied can be subjected to certain pre-treatment operations to facilitate formation of the inner layer and the outer layer. Examples of such pretreatment operations include surface roughening, such as by chemical etching or mechanical abrasion, and formation of a seed layer, such as by electroless plating.

Figure 6G:
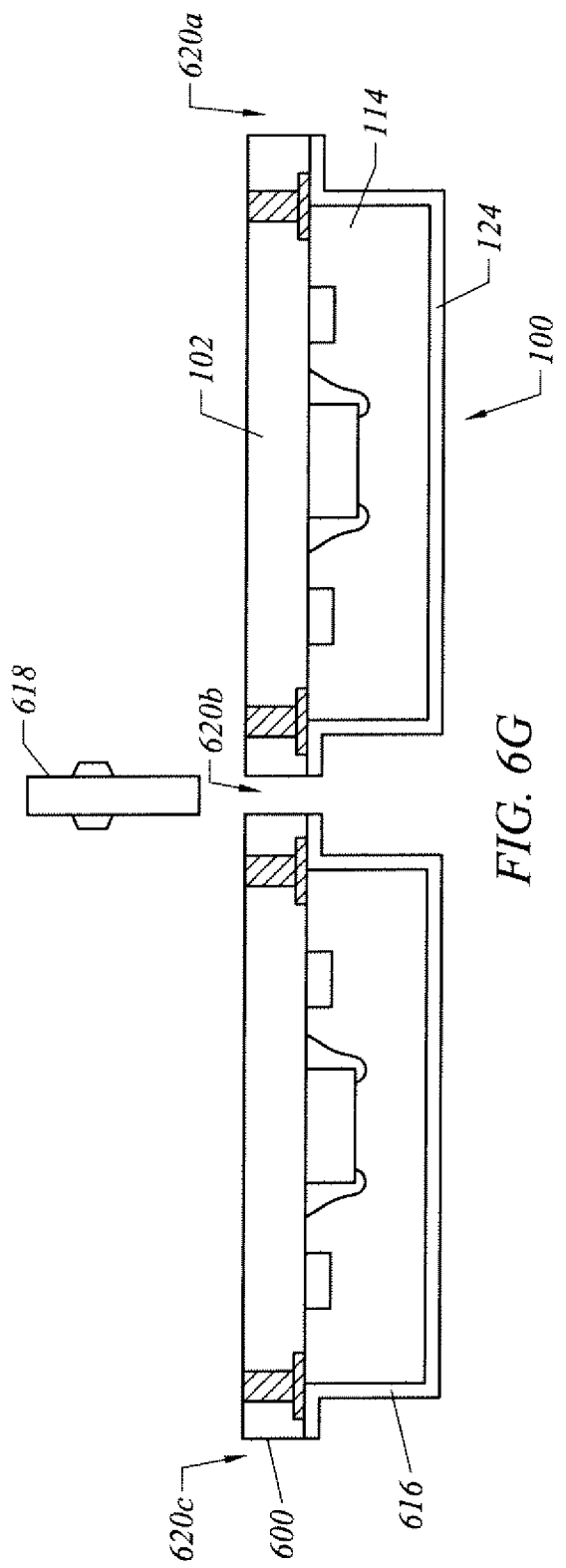
Figure 6H:
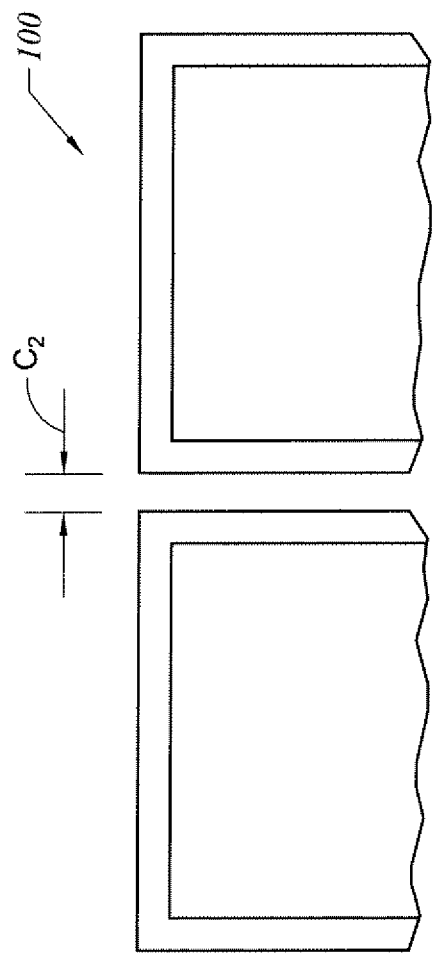

Once the EMI coating 616 is formed, the substrate 600 along with the EMI coating 616 are inverted, and singulation is carried out with respect to the lower surface 614 of the substrate 600 (in its inverted orientation). Such manner of singulation can be referred to as "back-side" singulation. Referring to FIG. 6G and FIG. 6H, the "back-side" singulation is carried out using a saw 618, which forms cutting slits 620a, 620b, and 620c. In particular, the cutting slits 620a, 620b, and 620c extend downwardly and completely through the substrate 600 and the EMI coating 616 (in their inverted orientation), thereby sub-dividing the substrate 600 and the EMI coating 616 into discrete units, including the substrate unit 102 and the EMI shield 124. In such manner, the package 100 is formed. For certain implementations, a width $C_2$ of each of the cutting slits 620a, 620b, and 620c (also sometimes referred to as a full-cut width) can be in the range of about 100 µm to about 600 µm, such as from about 200 µm to about 400 µm or from about 240 µm to about 360 µm. While not illustrated in FIG. 6G and FIG. 6H, it is contemplated that a tape can be used to secure the package 100 with respect to adjacent packages during the "back-side" singulation.

Attention next turns to FIG. 7A through FIG. 7D, which illustrate certain considerations when selecting a suitable spacing $L_3$ between nearest-neighbor grounding elements 700 and 700' of adjacent substrate units 702 and 702', according to an embodiment of the invention. For ease of presentation, the following scenarios are described assuming a given width $C_1$, which results from "front-side" singulation, and a given width $C_2$, which results from "back-side" singulation. By way of preview, it can be appreciated that $L_3$ desirably is at least about $C_2$ and is no greater than about $C_1$. Stated in another way, $L_3$ can be represented as: $C_2 \leq L_3 \leq C_1$.

Figure 7A:
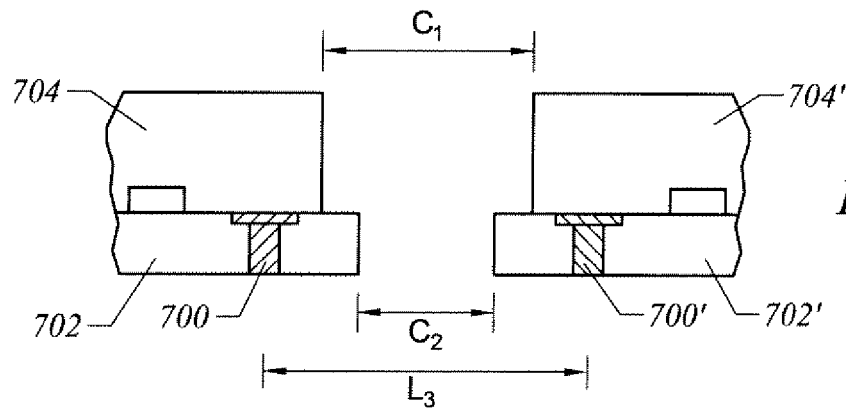
FIG. 7A through FIG. 7D illustrate certain considerations when selecting a spacing between grounding elements of adjacent substrate units, according to an embodiment of the invention.
Figure 7B:
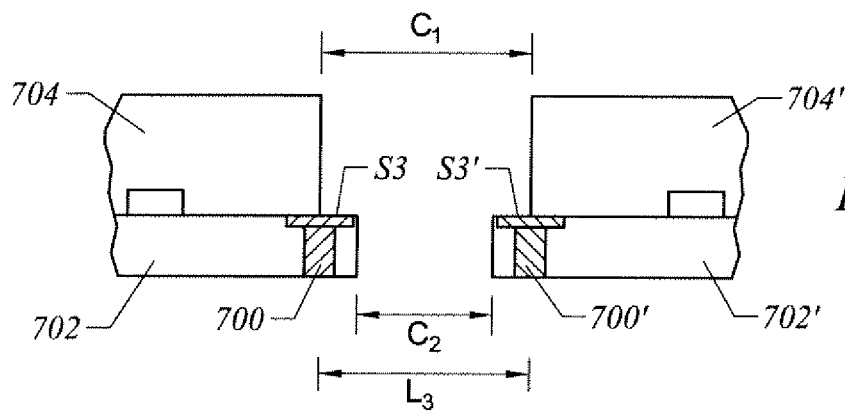

In accordance with a first scenario of FIG. 7A, $L_3$ is greater than $C_1$, and, thus, the grounding elements 700 and 700' are spaced farther apart than the width $C_1$ that results from the "front-side" singulation. Accordingly, after the "front-side" singulation, the grounding elements 700 and 700' remain substantially covered by package bodies 704 and 704', respectively. By contrast and in accordance with a second scenario of FIG. 7B, $L_3$ is about the same as $C_1$, and, thus, the grounding elements 700 and 700' are spaced apart by about the same extent as the width $C_1$ that results from the "front-side" singulation. Accordingly, after the "front-side" singulation, the grounding elements 700 and 700' are at least partially exposed, and can provide electrical pathways for reducing EMI. As illustrated in FIG. 7B, the grounding elements 700 and 700' include connection surfaces S3 and S3', respectively.

Figure 7C:
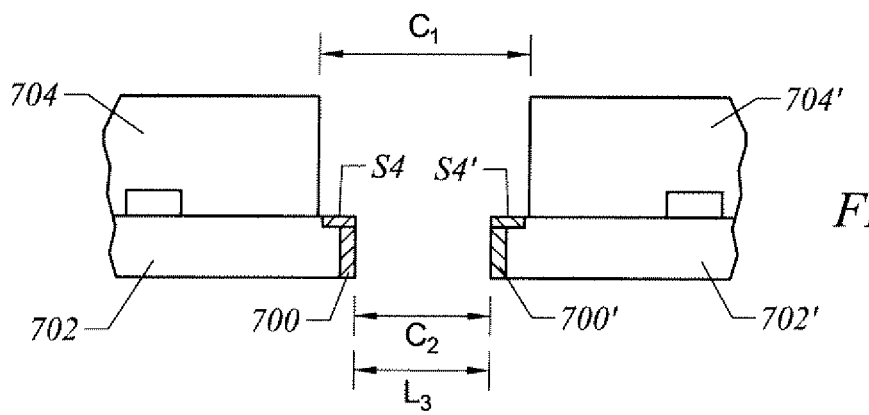
Figure 7D:
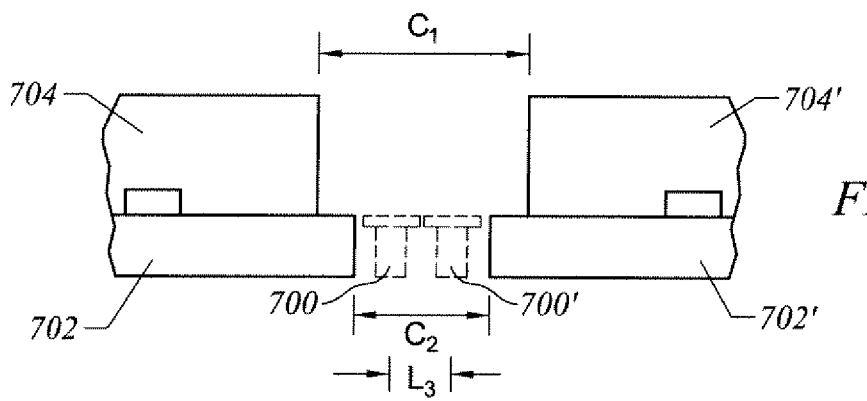

In accordance with a third scenario of FIG. 7C, $L_3$ is about the same as $C_2$, and, thus, the grounding elements 700 and 700' are spaced apart by about the same extent as the width $C_2$ that results from the "back-side" singulation. Accordingly, after the "back-side" singulation, remnants of the grounding elements 700 and 700' remain and are at least partially exposed to provide electrical pathways for reducing EMI. As illustrated in FIG. 7C, the remnants of the grounding elements 700 and 700' include connection surfaces S4 and S4', respectively. By contrast and in accordance with a fourth scenario of FIG. 7D, $L_3$ is less than $C_2$, and, thus, the grounding elements 700 and 700' are spaced closer together than the width $C_2$ that results from the "back-side" singulation. Accordingly, after the "back-side" singulation, substantially no remnants of the grounding elements 700 and 700' remain.

While the invention has been described with reference to the specific embodiments thereof it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a substrate including
     an upper surface,
     a lower surface, and
     a grounding element disposed adjacent to a periphery of the substrate and at least partially extending between the upper surface and the lower surface of the substrate, the grounding element including a connection surface disposed adjacent to and extending downwardly from a substantially planar portion of the upper surface of the substrate, wherein the connection surface is a curved surface extending outwardly from the substantially planar portion;
   a package body disposed adjacent to the upper surface of the substrate, a periphery of the package body being laterally recessed with respect to the periphery of the substrate, such that the connection surface of the grounding element is exposed; and
   an electromagnetic interference shield disposed adjacent to the package body and physically connected to the connection surface of the grounding element,
   wherein the grounding element provides an electrical pathway to ground.

2. The semiconductor package of claim 1, wherein the grounding element includes a via pad, and the connection surface of the grounding element includes an exposed lateral surface of the via pad.

3. The semiconductor package of claim 2, wherein the electromagnetic interference shield is physically connected to the exposed lateral surface of the via pad.

4. The semiconductor package of claim 1, further comprising a plurality of grounding elements including the grounding element, the plurality of grounding elements positioned around a periphery of the substrate and electrically connected to the electromagnetic interference shield.

5. The semiconductor package of claim 1, wherein the electromagnetic interference shield includes a curved portion that extends along the connection surface.

6. The semiconductor package of claim 5, wherein the curved portion terminates substantially at a periphery of the grounding element.

7. The semiconductor package of claim 1, wherein:
   the grounding element includes a first surface at the periphery of the substrate; and
   the connection surface is recessed relative to the first surface of the grounding element.

8. The semiconductor package of claim 1, wherein the grounding element corresponds to a remnant of a grounding via and the connection surface of the grounding element is disposed adjacent to a peripheral portion of the upper surface of the substrate.

9. A semiconductor package, comprising:
a substrate including
a first surface,
a second opposing surface, and
a grounding element at least partially extending between the first surface and the second opposing surface of the substrate, the grounding element corresponding to a remnant of a grounding via and including a connection surface disposed adjacent to a peripheral portion of the first surface of the substrate, wherein the connection surface is a curved surface having a concave profile extending from the first surface;
a package body disposed adjacent to the first surface of the substrate, a periphery of the package body being recessed with respect to a periphery of the substrate, such that the connection surface of the grounding element is exposed adjacent to the peripheral portion of the first surface of the substrate; and
an electromagnetic interference shield disposed adjacent to the package body and directly connected to the connection surface of the grounding element.

10. The semiconductor package of claim 9, wherein the grounding element includes a via pad remnant having a lateral surface which forms a portion of the grounding element.

11. The semiconductor package of claim 9, further comprising a plurality of grounding elements including the grounding element, the plurality of grounding elements positioned around a periphery of the substrate and electrically connected to the electromagnetic interference shield.

12. The semiconductor package of claim 9, wherein the grounding element includes a plated channel remnant, wherein the plated channel remnant at least partially extends between the first surface and the second opposing surface of the substrate.

13. The semiconductor package of claim 9, wherein the electromagnetic interference shield includes a lateral curved portion that extends along the connection surface.

14. The semiconductor package of claim 9, wherein the electromagnetic interference shield includes a first layer and a second layer disposed adjacent to the first layer, and the first layer and the second layer include different electrically conductive materials.

15. The semiconductor package of claim 9, wherein:
the grounding element includes a third surface at the periphery of the substrate; and
the connection surface is recessed relative to the third surface of the grounding element.

16. A semiconductor package, comprising:
a substrate including an upper surface, a lower surface, and a grounding element at least partially extending between the upper surface and the lower surface of the substrate, the grounding element including a first surface and a second surface, and at least a portion of the first surface is exposed at a periphery of the substrate, wherein the first surface is a curved surface having a concave profile extending from the upper surface of the substrate, and wherein the first surface is adjacent to the upper surface of the substrate, the second surface is adjacent to the lower surface of the substrate, and the first surface is recessed relative to the second surface;
a package body disposed adjacent to the upper surface of the substrate; and
an electromagnetic interference shield disposed adjacent to the package body and electrically connected to at least the first surface of the grounding element.

17. The semiconductor package of claim 16, wherein the grounding element includes a via pad remnant having a lateral surface which forms a portion of the grounding element.

18. The semiconductor package of claim 16, further comprising a plurality of grounding elements including the grounding element, the plurality of grounding elements positioned around a periphery of the substrate and electrically connected to the electromagnetic interference shield.

19. The semiconductor package of claim 16, wherein the grounding element includes a plated channel remnant, wherein the plated channel remnant at least partially extends between the upper surface and the lower surface of the substrate.

20. The semiconductor package of claim 16, wherein the electromagnetic interference shield includes a lateral curved portion that extends along the first surface.

21. The semiconductor package of claim 16, wherein the electromagnetic interference shield includes a first layer and a second layer disposed adjacent to the first layer, and the first layer and the second layer include different electrically conductive materials.

22. The semiconductor package of claim 16, wherein the grounding element corresponds to a remnant of a grounding via and the first surface of the grounding element includes a connection surface disposed adjacent to a peripheral portion of the upper surface of the substrate.

\* \* \* \* \*